(12) United States Patent
Sarwary et al.

(10) Patent No.: US 8,656,328 B1
(45) Date of Patent: Feb. 18, 2014

(54) SYSTEM AND METHOD FOR ABSTRACTION OF A CIRCUIT PORTION OF AN INTEGRATED CIRCUIT

(71) Applicant: Atrenta, Inc., San Jose, CA (US)

(72) Inventors: Mohamed Shaker Sarwary, San Diego, CA (US); Mohammed Movahed-Ezazi, Saratoga, CA (US); Barsneya Chakrabarti, Noida (IN); Manish Gupta, Noida (IN); Chandan Kumar, Ghaziabad (IN)

(73) Assignee: Atrenta, Inc., San Jose, CA (US)

( * ) Notice: Subject to any disclaimer, the term of this patent is extended or adjusted under 35 U.S.C. 154(b) by 0 days.

(21) Appl. No.: 13/791,492

(22) Filed: Mar. 8, 2013

(51) Int. Cl.
 *G06F 9/455* (2006.01)
 *G06F 17/50* (2006.01)

(52) U.S. Cl.
 USPC .............................. 716/106; 716/111; 716/112

(58) Field of Classification Search
 USPC .......................................... 716/106, 111, 112
 See application file for complete search history.

(56) References Cited

U.S. PATENT DOCUMENTS

| | | | |
|---|---|---|---|
| 6,363,520 B1 * | 3/2002 | Boubezari et al. | 716/103 |
| 6,493,864 B1 | 12/2002 | Liu | |
| 6,622,290 B1 | 9/2003 | Ginetti et al. | |
| 7,103,863 B2 | 9/2006 | Riepe et al. | |
| 7,237,208 B1 | 6/2007 | Ip et al. | |
| 7,418,678 B1 | 8/2008 | Ip et al. | |
| 7,421,669 B2 | 9/2008 | Baumgartner et al. | |
| 7,614,028 B1 | 11/2009 | Nequist et al. | |
| 7,647,572 B1 | 1/2010 | Ip et al. | |
| 7,657,860 B1 | 2/2010 | Brashears et al. | |
| 7,856,609 B2 | 12/2010 | Baumgartner et al. | |
| 7,895,552 B1 | 2/2011 | Singhal et al. | |
| 7,937,678 B2 | 5/2011 | Lippmann et al. | |
| 7,941,774 B2 | 5/2011 | Luan et al. | |
| 7,971,173 B1 | 6/2011 | Brashears et al. | |
| 8,122,404 B2 | 2/2012 | Sinha et al. | |
| 8,181,132 B2 | 5/2012 | Jain et al. | |
| 8,245,166 B2 | 8/2012 | Baumgartner et al. | |
| 2003/0125920 A1 | 7/2003 | Matsuoka et al. | |
| 2004/0078767 A1 | 4/2004 | Burks et al. | |
| 2007/0174799 A1 * | 7/2007 | Baumgartner et al. | 716/5 |
| 2008/0295043 A1 | 11/2008 | Chang et al. | |

* cited by examiner

*Primary Examiner* — Suresh Memula
(74) *Attorney, Agent, or Firm* — Thomas Schneck; Mark Protsik

(57) ABSTRACT

A system, such as a computer aided design (CAD) system, is configured to abstract at least a portion of an integrated circuit (IC) design provided thereto. The system selects two signals of the IC and determines the respective sub-circuits ending at each of the signals, excluding the other sub-circuit when two sub-circuits intersect. It then identifies an intersection of the two sub-circuits and therefore establishes an abstraction therefrom. The abstraction replaces the circuit for verification purposes of the IC design. The process can repeat as may be necessary or until no two signals have sub-circuits that intersect. The process described for two signals is equally applicable to a plurality of signals for which the intersection is defined as the intersection of all the sub-circuits defined by the plurality signals. The abstraction allows for effective verification of portions of ICs as may be necessary.

28 Claims, 2 Drawing Sheets

SYSTEM AND METHOD FOR ABSTRACTION OF A CIRCUIT PORTION OF AN INTEGRATED CIRCUIT

TECHNICAL FIELD

This invention relates to the field of circuit design verification and in particular integrated circuit design verification. More particularly the invention relates to a system, method and computer program product for abstraction of portions of a circuit for functional verification of properties in an integrated circuit.

BACKGROUND ART

In the verification process of an integrated circuit (IC) there often arises a need to verify functionality of a portion of the circuit from one Flip-Flop (FF) to another along a data path. It is useful to have an efficient and reliable method for these verification tests, as they usually involve a large number of logic components, which complicate the verification testing.

In order to solve issues related to verification of complex designs various ways of abstraction are used. For example, a memory block is not described by its components but by an abstraction of a memory, once the memory block has been tested and verified for correctness of the design. Other blocks include processors, clocks, power regulators, multiplexers, and so on and so forth. However, in many cases circuits are designed that are complex and not built using standard intellectual property (IP) blocks. For example, a protocol may have multiple state machines that control various aspects of a specific IC, however, it cannot be readily abstracted to pinpoint the specific state machine relevant for a given property using prior art techniques.

It would therefore be advantageous to provide a method that overcomes the limitations of the prior art. Specifically, it would be advantageous to provide an automatic solution for abstracting portions of circuits of an IC that are not provided explicitly as integral blocks.

SUMMARY DISCLOSURE

A method implemented in a programmed computer is provided for abstraction of a data path for functional verification of a design for an integrated circuit (IC). The method is performed by a data processing system containing a processing unit and memory storing the program instructions executed by the processing unit and a description of the integrated circuit being extracted. Thus, the method may be embodied in a tangible computer software product containing program instructions that when executed on a computer in conjunction with a received circuit description perform the method.

The method begins by receiving a description of the integrated circuit from storage accessible to the computer. Locations of a plurality of (at least first and second) signals of the IC are selected from the description and then corresponding first and second sub-circuits determined to be driving the respective first and second signals are extracted, wherein extraction of a sub-circuit ceases at all termination points of the sub-circuit (such as a primary output of the IC, or the first or second signals themselves). The first and second signals can be coupled by a circuit path. Those signals may also be selected from a primary output of the IC or an output of a circuit element of the IC, including the output of a flip-flop (FF) of the IC. For example, the first and second signals might be outputs of a launch FF and of a capture FF, respectively. The signals could also be respective control signals in a data path of the IC. A sub-circuit driving a signal may comprise a cone of influence of logic.

Next, intersection circuitry between the first and second sub-circuits is identified. An abstraction is generated for at least a portion of the IC comprising at least the intersection circuitry and at least one path from the intersection circuitry to any of the first and second signals, and that abstraction is stored in a memory. The path or paths in the abstraction may be selected from those that are responsive to a desired verification goal, and may include all paths from the intersection circuitry to the first and second signals.

DETAILED DESCRIPTION

Figure 1:
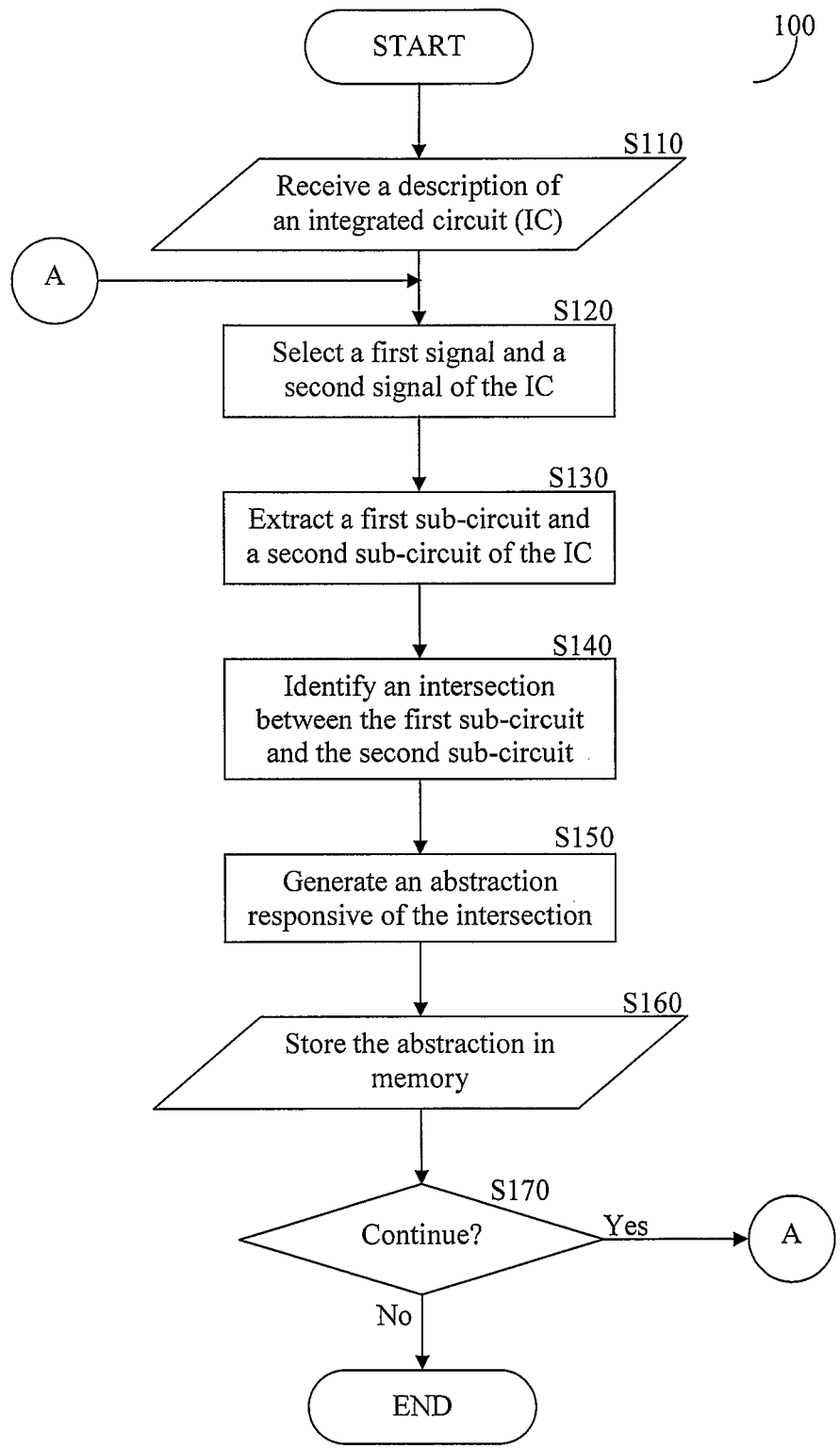
FIG. 1 is a flowchart of a method for abstraction of a data path of an integrated circuit according to an embodiment.

A system, such as a computer aided design (CAD) system, for use in the present invention is configured to abstract at least a portion of an integrated circuit (IC) design provided thereto. The system selects at least two signals of the IC and determines the respective sub-circuits ending at each of the signals, excluding the other sub-circuit when two sub-circuits intersect. It then identifies an intersection of the two sub-circuits and therefore establishes an abstraction therefrom. The abstraction replaces the circuit for verification purposes of the IC design. The process can repeat as may be necessary or until no two signals have sub-circuits that intersect. The process described for two signals is equally applicable to a plurality of signals for which the intersection is defined as the intersection of all the sub-circuits defined by the plurality signals. The abstraction allows for effective verification of portions of ICs as may be necessary.

According to an embodiment of the invention, it is useful, when attempting to run a verification test from one FF to another, to obtain the control logic. For the purpose of this technique, the control logic is defined as all the logic components shared by the signal of the first FF defining a starting point and the signal of the second FF defining an end point. The starting point may, for example, be a launch FF and the end point may be, for example, a capture FF. Also for the purpose of this technique, we define an intersection as logic components which feed to both the input of the logic of the launch FF and the input of the logic of the capture FF. The intersection may also be defined as the intersection between two cones of influence (COI) of logic originating at different FFs. It is possible to analyze the shared logic as a control logic controlling both the launch and capture FFs. This can be also seen as a data path with two operators. The data path is controlled by a state machine represented by the intersection. This state machine is then sent to the formal engine for the verification testing as is required.

Therefore, this provides a technique to isolate control logic from data-path logic. As a result verification effort can be focused on control logic regardless of data-path complexity. For example, in a handshake design, a state machine is responsible for correct handoff of a data from a sender to a receiver component. In such case, a verification tool must ensure that the control logic performs handoff of the data as defined by a protocol, regardless of what the data represents, as the data in itself is irrelevant for the verification and therefore can be abstracted. Similarly, when a path is defined as a multi-cycle path, typically used to help meeting the timing in the implementation of an integrated circuit, any data transferred across the path must take more than one cycle. In this case too, the data is irrelevant, and verification must concentrate on the control path. For all such cases, this technique teaches extraction of the control logic to assist in verification closure with a faster run time. A person of ordinary skill in the art would appreciate that this teaching is applicable to a circuit, regardless of its representation as a register-transfer level (RTL), or as a synthesized design, commonly referred to as a netlist.

Reference is now made to FIG. 1, which depicts an exemplary and non-limiting flowchart 100 of a computerized method for abstraction of a portion of a circuit, for example a data path. In S110 a description of an IC, or portion thereof, is provided. In S120 a first signal and a second signal are selected from signals of the IC. The first and second signals may be coupled by at least a circuit path. In an alternative embodiment, the first and second signal may be an output of a FF, a primary output or an output of a circuit element. In yet another embodiment the first signal is an output of a launch FF and the second signal is an output of a capture FF. In S130 there are extracted a first sub-circuit and a second sub-circuit composed of a COI of logic driving from each of the first signal and the second signal respectively. The extraction may cease at any of a primary input, the first signal or the second signal. That is, in order to define the borders of the COI of the logic, the extraction process continues until it meets any one of the termination points; the process of extraction ceases when all termination points have been reached. In S140 an intersection between the first sub-circuit and the second sub-circuit is identified. In S150 an abstraction composing the intersection, all the paths from the intersection to the first signal and the second signal, and additional signals, e.g. the paths between the first and second signal, as needed for the specific property verification is generated. In S160 the abstraction model is stored in memory. The abstracted model may be now used instead of the detailed description when performing verification of the IC. In S170 it is checked whether additional abstraction is necessary and if so execution continues with S120, i.e., the process begins anew with a new set of selected signals; otherwise, execution terminates. While the descriptions herein discuss the exemplary and non-limiting case of selection of two signals, it should be understood that a plurality of signals may be chosen in an embodiment, a corresponding number of sub-circuits would be determined and the intersections between the sub-circuits identified. Hence one of ordinary skill in the art would be able to adapt the teachings herein to be operative with a plurality of selected signals and without departing from the scope of the invention.

Figure 2:
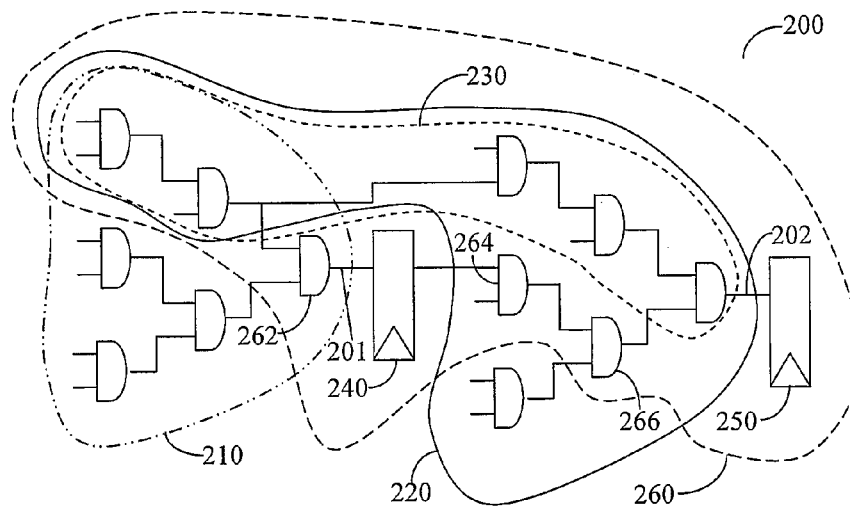
FIG. 2 is a schematic circuit abstracted according to an embodiment.

FIG. 2 depicts and exemplary and non-limiting schematic circuit 200 abstracted according to an embodiment. In S120 signal 201, which is an input to flip-flop (FF) 240, and signal 202, which is an input to flip-flop (FF) 250, are selected. In 5130 a first sub-circuit 210 is extracted and a second sub-circuit 220 is selected. In S140 the intersecting circuitry 230 is identified. In S150 the abstraction model is generated from the circuit elements enclosed in 260. The abstraction 260 includes the intersection circuitry 230, FF 240, FF 250, as well as logical elements 262, 264 and 266 which close the paths between signal 201 and 202. One of ordinary skill in the art would readily understand that the circuitry added in addition to the intersecting circuitry 230 includes additional signals as may be required to satisfy specific verification goals, which, for example, include all paths from the intersection to the selected signals 201 and 202.

Figure 3:
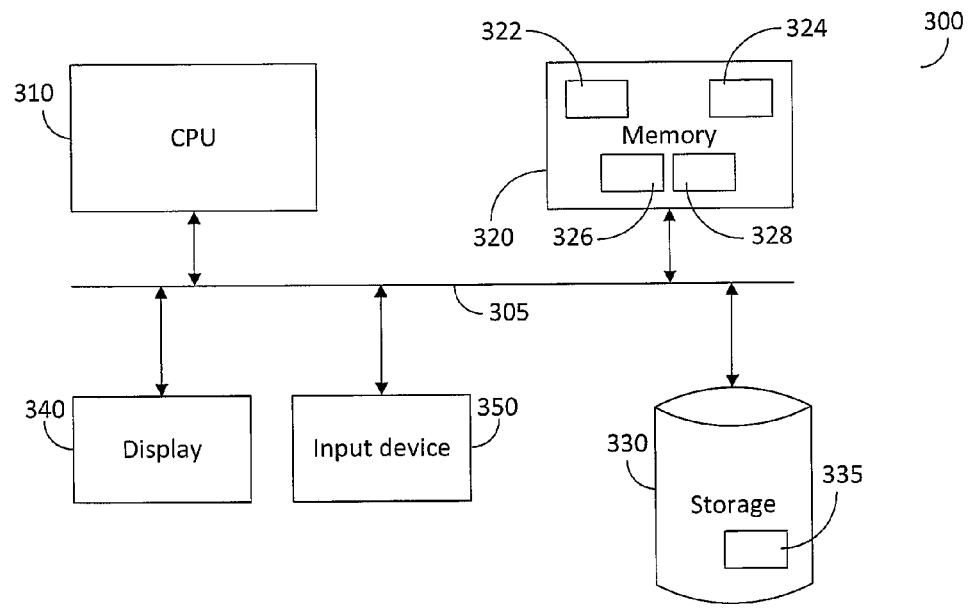
FIG. 3 is a schematic block diagram of a system for deployment of a computerized method for abstraction of a data path of an integrated circuit according to an embodiment.

FIG. 3 shows an exemplary and non-limiting system 300, such as a CAD system, implemented according to an embodiment. The system 300 comprises a processing unit 310, for example, a central processing unit (CPU) that is coupled via a bus 305 to a memory 320. The memory 320 further comprises a memory portion 322 that contains instructions that when executed by the processing unit 310 performs the method described in more detail herein. The memory may be further used as a working scratch pad for the processing unit 310, a temporary storage, and others, as the case may be. The memory may comprise of volatile memory such as, but not limited to random access memory (RAM), or non-volatile memory (NVM), such as, but not limited to, Flash memory. The processing unit 310 may be coupled to a display unit 340, e.g., a computer screen, an input device 350, e.g., a mouse and/or a keyboard, and data storage 330. Data storage 330 may be used for the purpose of holding a copy of the method executed in accordance with the disclosed technique. Data storage 330 may further comprise storage portion 335 containing the aforementioned abstraction, as well as, but not limited to, the description of the IC, for example in RTL, including its sub-circuits discussed hereinabove, and the signal discussed thereto.

The principles of the invention are implemented as hardware, firmware, software or any combination thereof, including but not limited to a CAD system and software products thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit and/or display unit.

What is claimed is:

1. A method implemented in a programmable system for abstraction of a data path for functional verification of a design for an integrated circuit, the method comprising:
   receiving a description of the integrated circuit from a storage accessible to the system;
   selecting from the received description a location for a first signal in the circuit;
   selecting from the received description a location for a second signal in the circuit;
   extracting a first sub-circuit driving the first signal;
   extracting a second sub-circuit driving the second signal;
   identifying an intersection circuitry between the first sub-circuit and the second sub-circuit;
   generating an abstraction of at least a portion of the circuit comprising at least the intersection circuitry and all paths from the intersection circuitry to any of the first signal and the second signal; and
   storing the abstraction in a memory;
   wherein extraction of a sub-circuit ceases at all termination points of the sub-circuit.

2. The method of claim 1, wherein generating an abstraction further comprises at least one path from the intersection circuitry to any one of the first signal and the second signal.

3. The method of claim 2, wherein the at least one path is selected at least responsive to a desired verification goal.

4. The method of claim 1, wherein the first signal and the second signal are coupled by at least one circuit path.

5. The method of claim 1, wherein the first signal and the second signal are selected from a list comprising: an output of a flip-flop (FF) of the integrated circuit, a primary output of the integrated circuit, and an output of a circuit element of the integrated circuit.

6. The method of claim 5, wherein the first signal is an output of a launch FF and the second signal is an output of a capture FF.

7. The method of claim 1, wherein the first signal and the second signal are respective control signals of a data path of the integrated circuit.

8. The method of claim 1, wherein the sub-circuit comprises a cone of influence (COI) of logic.

9. The method of claim 1, wherein a termination point is at least at any one of: primary outputs, the first signal, the second signal.

10. The method of claim 1, wherein the programmable system is selected from any of a computer system, a processing unit, or a computer-aided design (CAD) system.

11. A data processing system for performing abstraction of a selected data path in a design for an integrated circuit for use in functional verification of the data path for that circuit, comprising:
 a processing unit;
 a storage coupled to the processing unit; and
 a memory coupled to the processing unit, the memory containing instructions that when executed by the processing unit:
  receive a description of an integrated circuit from the storage;
  select from the received description a location of a first signal in the circuit and the location of a second signal in the circuit;
  extract a first sub-circuit driving the first signal;
  extract a second sub-circuit driving the second signal;
  identify an intersection circuitry between the first sub circuit and the second sub-circuit; and
  generate an abstraction comprising at least the intersection circuitry and store the abstraction in the memory.

12. The system of claim 11, wherein generating an abstraction further comprises at least one path from the intersection circuitry to any one of the first signal and the second signal.

13. The system of claim 12, wherein the at least one path is selected at least responsive to a desired verification goal.

14. The system of claim 11, wherein extract of a sub circuit ceases at all termination points of the sub-circuit.

15. The system of claim 14, wherein a termination point is at least at any one of: primary outputs, the first signal, the second signal.

16. The system of claim 11, wherein the first signal and the second signal are coupled by at least a circuit path.

17. The system of claim 11, wherein the first signal and the second signal are selected from a list comprising: an output of a flip-flop (FF) of the integrated circuit, a primary output of the integrated circuit, and an output of a circuit element of the integrated circuit.

18. The system of claim 17, wherein the first signal is an output of a launch FF and the second signal is an output of a capture FF.

19. The system of claim 11, wherein the first signal and the second signal are respective control signals of a data path of the integrated circuit.

20. The system of claim 11, wherein the sub-circuit comprises a cone of influence (COI) of logic.

21. The system of claim 11 that comprises a programmable general-purpose computer system or a computer-aided design (CAD) system.

22. A method implemented in a programmable system for abstraction of a data path for functional verification of a design for an integrated circuit, the method comprising:
 receiving a description of the integrated circuit from a storage accessible to the system;
 selecting from the received description a location for a plurality of signals in the circuit;
 extracting a plurality of sub-circuits each sub-circuit driving a corresponding signal of the plurality of signals;
 identifying an intersection circuitry between the plurality of sub-circuits;
 generating an abstraction of at least a portion of the circuit comprising at least the intersection circuitry and additional signals as needed by specific verification goal which can include all paths from the intersection to any of the plurality of signals; and
 storing the abstraction in a memory;
 wherein extraction of a sub-circuit ceases at all termination points of the sub-circuit.

23. The method of claim 22, wherein generating an abstraction further comprises at least one path from the intersection circuitry to any one of the first signal and the second signal.

24. The method of claim 23, wherein the at least one path is selected at least responsive to a desired verification goal.

25. The method of claim 22, wherein the plurality of signals are coupled by at least one circuit path.

26. The method of claim 22, wherein the plurality of signals are selected from a list comprising: an output of a flip-flop (FF) of the integrated circuit, a primary output of the integrated circuit, and an output of a circuit element of the integrated circuit.

27. The method of claim 22, wherein the sub-circuit comprises a cone of influence (COI) of logic.

28. The method of claim 22, wherein a termination point is at least at any one of: primary outputs, the first signal, the second signal.

* * * * *

UNITED STATES PATENT AND TRADEMARK OFFICE
CERTIFICATE OF CORRECTION

PATENT NO.        : 8,656,328 B1                              Page 1 of 1
APPLICATION NO.   : 13/791492
DATED             : February 18, 2014
INVENTOR(S)       : Mohamed Shaker Sarwary et al.

It is certified that error appears in the above-identified patent and that said Letters Patent is hereby corrected as shown below:

Title page at Item (72) should read:

-- (72) Inventors: Mohamed Shaker Sarwary, San Diego, CA (US); Mohammed Movahed-Ezazi, Saratoga, CA (US); Barsneya Chakrabarti, Noida (IN); Manish Geol, Noida (IN); Chandan Kumar, Ghaziabad (IN) --

Signed and Sealed this
Thirteenth Day of May, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,656,328 B1 | Page 1 of 1 |
| APPLICATION NO. | : 13/791492 | |
| DATED | : February 18, 2014 | |
| INVENTOR(S) | : Mohamed Shaker Sarwary et al. | |

It is certified that error appears in the above-identified patent and that said Letters Patent is hereby corrected as shown below:

Title page at Item (72) should read:

-- (72) Inventors: Mohamed Shaker Sarwary, San Diego, CA (US); Mohammed Movahed-Ezazi, Saratoga, CA (US); Barsneya Chakrabarti, Noida (IN); Manish Goel, Noida (IN); Chandan Kumar, Ghaziabad (IN) --

This certificate supersedes the Certificate of Correction issued May 13, 2014.

Signed and Sealed this
Ninth Day of September, 2014

Michelle K. Lee
*Deputy Director of the United States Patent and Trademark Office*